United States Patent
Lin

(10) Patent No.: US 7,102,414 B2
(45) Date of Patent: Sep. 5, 2006

(54) MUTING CIRCUIT FOR AUDIO AMPLIFIER

(75) Inventor: Wei Cheng Lin, Taipei (TW)

(73) Assignee: Princeton Technology Corporation, Taipei (TW)

( * ) Notice: Subject to any disclaimer, the term of this patent is extended or adjusted under 35 U.S.C. 154(b) by 78 days.

(21) Appl. No.: 11/004,889

(22) Filed: Dec. 7, 2004

(65) Prior Publication Data

US 2006/0076998 A1    Apr. 13, 2006

(51) Int. Cl.
*H03G 3/00*    (2006.01)
*H03B 1/00*    (2006.01)
*H03K 5/22*    (2006.01)

(52) U.S. Cl. .................. 327/419; 381/104; 381/107; 330/297

(58) Field of Classification Search ............. 327/419, 327/441, 376–377, 563; 330/127, 130, 296, 330/297; 381/104, 107, 109

See application file for complete search history.

(56) References Cited

U.S. PATENT DOCUMENTS

| 4,398,060 | A | * | 8/1983 | Ienaka et al. ............. 381/4 |
| 5,166,983 | A | * | 11/1992 | Susak ..................... 381/104 |
| 5,825,251 | A | * | 10/1998 | Nakagawa ............... 330/297 |

* cited by examiner

*Primary Examiner*—Dinh T. Le
(74) *Attorney, Agent, or Firm*—Birch, Stewart, Kolasch & Birch, LLP

(57) ABSTRACT

A muting circuit for an audio amplifier comprises differential pairs of MOS transistors in a differential amplifier and two sets of MOS transistor switch to control the differential pairs respectively. The differential pairs are connected with a current mirror circuit and the two sets of MOS transistor switch control the first differential pair and the second differential pair of the differential pairs respectively. A muting signal controls one of the two sets of MOS transistor switch through an inverter, while controls the other of the two sets of MOS transistor switch via two inverters connected in series, so that the muting signal is able to open/close the first differential pair or the second differential pair to form a muting effect.

2 Claims, 5 Drawing Sheets

MUTING CIRCUIT FOR AUDIO AMPLIFIER

FIELD OF THE INVENTION

The present invention relates to a muting circuit design for audio amplifier, and more particularly to the duplication of a differential pair in a differential amplifier; two sets of MOS transistor switch are used to control the differential pairs respectively.

BACKGROUND OF THE INVENTION

Referring to FIG. 1, which shows a conventional muting circuit design for audio amplifier. A pair of CMOS switchs M1 and M2 is added in the audio path of the audio amplifier, in which M1 is an NMOS, while M2 is a PMOS. The audio signal $V_{in}$ is inputted to the drains of the CMOS switchs M1 and M2, then passes through the sources of the CMOS switchs M1 and M2 to be inputted to the amplifier OP4 for generating an output signal $V_{out}$. A muting signal $M_0$ passes through two inverters INV5 and INV6 for controlling the gates of M1 and M2 respectively, and controlling a bias switch M3, as shown in the figure.

When the muting signal $M_0$ is "1" (high voltage) (means performing the muting function), the CMOS switchs M1 and M2 will be opened, M3 will be conducting, the audio signal $V_{in}$ will be blocked, and a constant bias $V_{reference}$ will be inputted to the amplifier OP4, thus forming the muting effect. The equivalent circuit thereof is shown in FIG. 2.

When the muting signal $M_0$ is "0" (low voltage) (means no muting), the CMOS switchs M1 and M2 will be conducting, M3 will be opened, the audio signal $V_{in}$ passes through the CMOS switchs M1 and M2 to be inputted to the amplifier OP4. The equivalent circuit thereof is shown in FIG. 3, in which the CMOS switchs M1 and M2 become a resistor $R_{on}$, M3 is opened without any effect, the input resistance of the amplifier OP4 is $R_i$, therefore the input signal $V_i$ of the amplifier OP4 equals to $V_{in} \times R_i/(R_{on}+R_i)$.

Referring to FIG. 4, which shows the resistance characteristics of the CMOS switchs M1 and M2. $R_{M1}$ represents the characteristic curve of the resistance of switch M1 according to the variation of the voltage. $R_{M2}$ represents the characteristic curve of the resistance of switch M2 according to the variation of the voltage. $R_{on}$ represents the characteristic curve of the combined resistance of switchs M1 and M2 according to the variation of the voltage when the input signal is small. Since $R_{M1}$, $R_{M2}$ and $R_{on}$ vary according to the voltage, $V_i$ varies according to the variation of $R_{on}$, and causes input distortion to the amplifier OP4. Therefore this muting circuit is not a good design.

OBJECT OF THE INVENTION

It is therefore an object of the present invention to provide a muting circuit design for audio amplifier by duplicating a differential pair in a differential amplifier, and use two sets of MOS transistor switch to control the differential pairs respectively. Both of the two differential pairs are connected with a current mirror circuit.

The two sets of MOS transistor switch control the open/conducting of the first differential pair and the second differential pair respectively. A muting signal controls one of the two sets of MOS transistor switch through an inverter, while controls the other of the two sets of MOS transistor switch via two inverters connected seriesly. Therefore the muting signal is able to open/close the first differential pair or the second differential pair so as to form the muting effect.

Each of the two sets of MOS transistor switch comprises three MOS transistors, so totally there are six transistors.

The first set of MOS transistor switch uses a first MOS transistor as a bridge for providing a power source to the first differential pair, and uses a second and a third MOS transistors for receiving the muting signal via an inverter to control the first MOS transistor to provide the power source to the first differential pair.

The second set of MOS transistor switch uses a fourth MOS transistor as a bridge for providing a power source to the second differential pair, and uses a fifth and a sixth MOS transistors for receiving the muting signal via two inverters to control the fourth MOS transistor to provide the power source to the second differential pair.

DETAILED DESCRIPTION OF THE INVENTION

Figure 1:
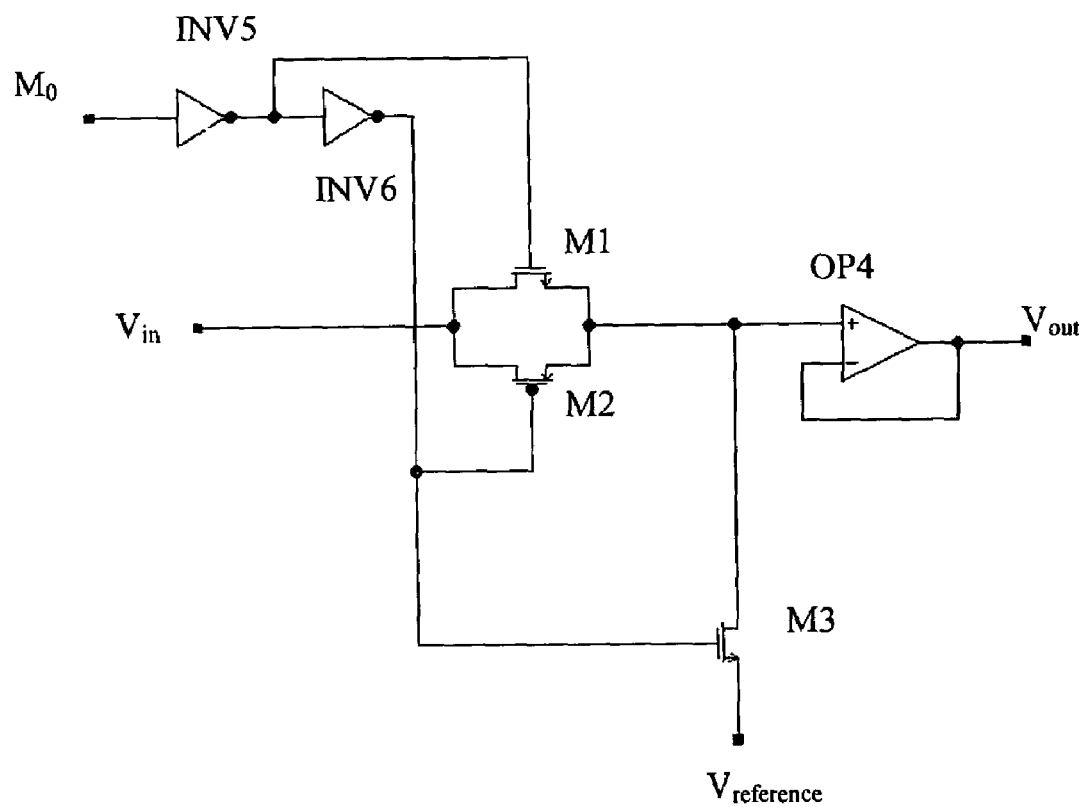
FIG. 1 shows a conventional muting circuit for audio amplifier.
Figure 2:
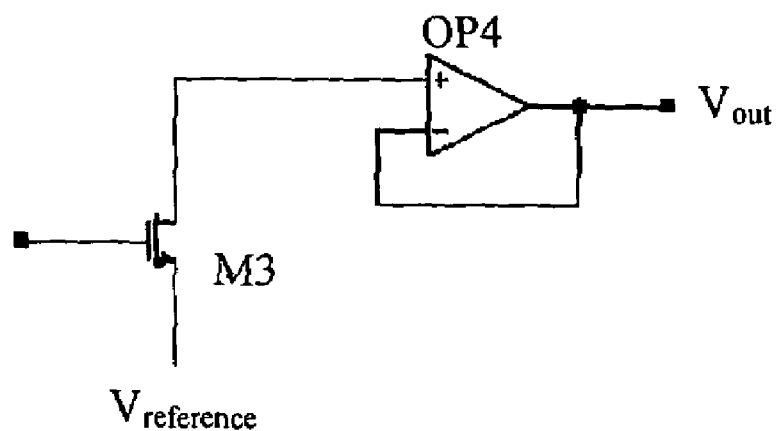
FIG. 2 shows the equivalent circuit of the conventional muting circuit for audio amplifier when the muting signal is a high voltage signal.
Figure 3:
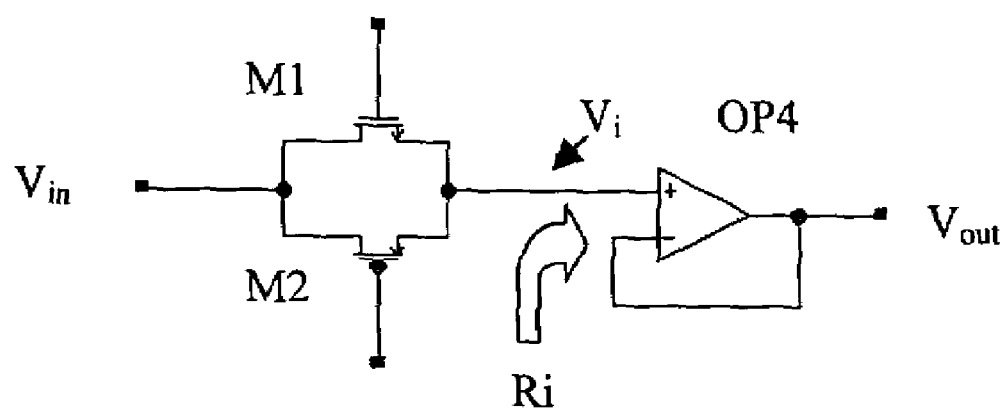
FIG. 3 shows the equivalent circuit of the conventional muting circuit for audio amplifier when the muting signal is a low voltage signal.
Figure 4:
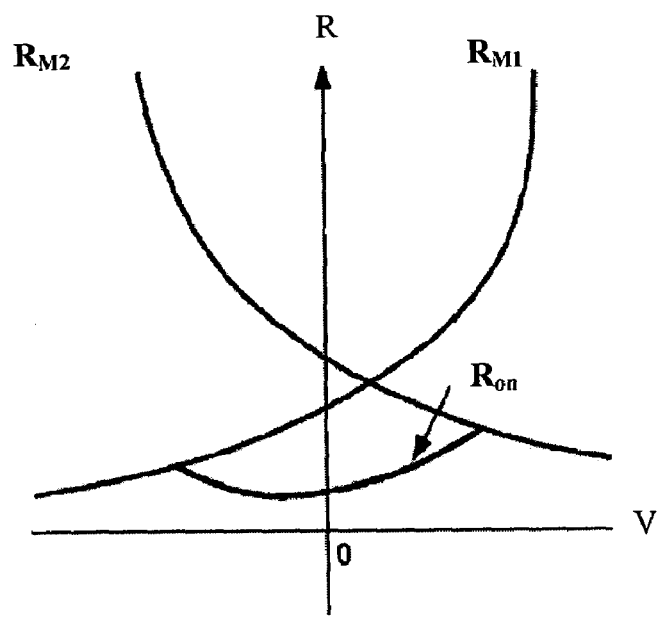
FIG. 4 shows the resistance characteristic curve of a CMOS switch.
Figure 5:
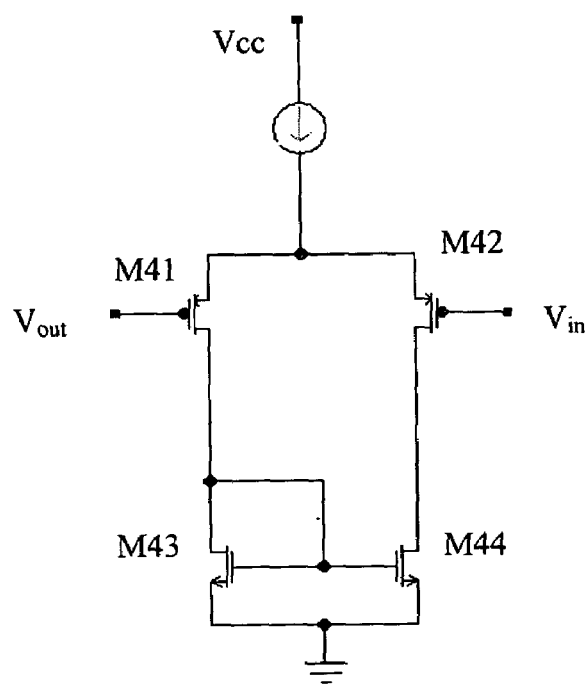
FIG. 5 shows a differential amplifier circuit diagram.

Referring to FIG. 5, which shows a differential amplifier circuit diagram. PMOS M41 and M42 form a differential pair, NMOS M43 and M44 form a current mirror. The audio signal $V_{in}$ is inputted to M42, and generates an output signal at M41.

Figure 6:
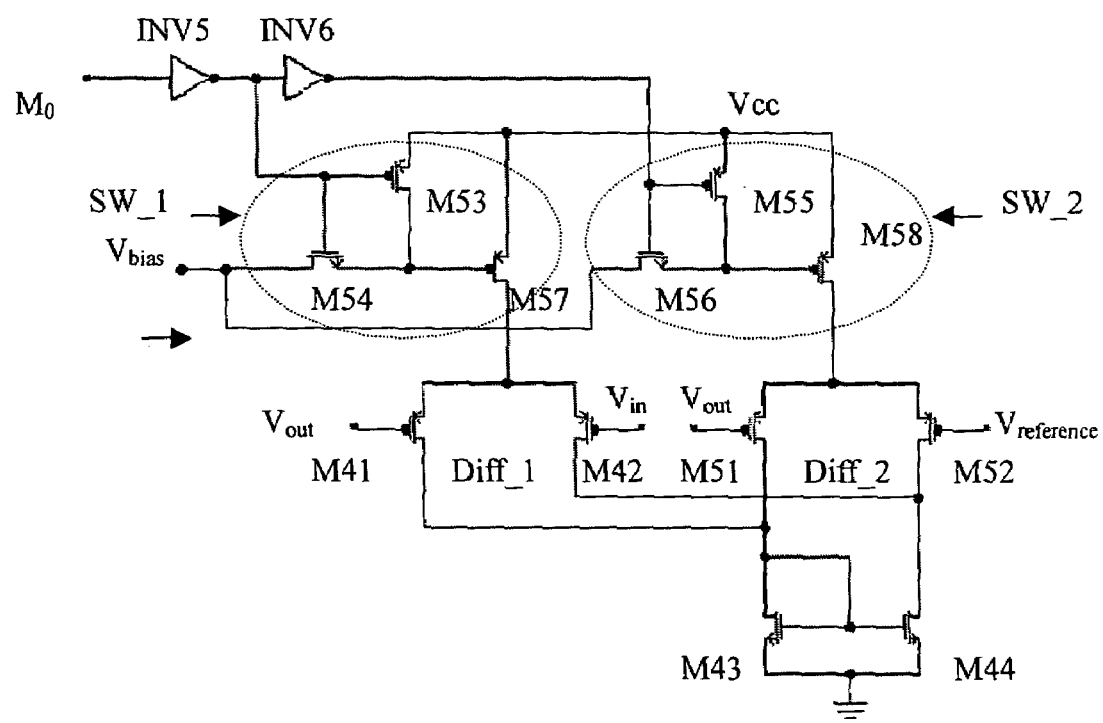
FIG. 6 shows a muting circuit in accordance with the present invention.

The present invention utilizes the differential amplifier circuit in FIG. 5 to design a muting circuit for audio amplifier in FIG. 6. Referring to FIG. 6, there are two sets of differential pair Diff_1 and Diff_2, both are connected with the current mirror circuit M43 and M44. Diff_1 is composed of PMOS M41 and M42, while Diff_2 is composed of PMOS M51 and M52. Diff_1 is connected with $V_{in}$ and $V_{out}$, Diff_2 is connected with the bias $V_{reference}$ and $V_{out}$.

The present invention designs two sets of switch circuit SW_1 and SW_2 above the the two sets of differential pair Diff_1 and Diff_2 respectively, and let the muting signal $M_0$ controls the switch circuits SW_1 and SW_2 via two inverters INV5 and INV6 respectively, as shown in FIG. 6. The switch circuit SW_1 and SW_2 controls Diff_1 and Diff_2 respectively. The switch circuit SW_1 is composed of PMOS M53, M54 and M57, and the switch circuit SW_2 is composed of PMOS M55, M56 and M58. PMOS M57, M58 provide Vcc to the circuit Diff_1, Diff_2 respectively.

Figure 7:
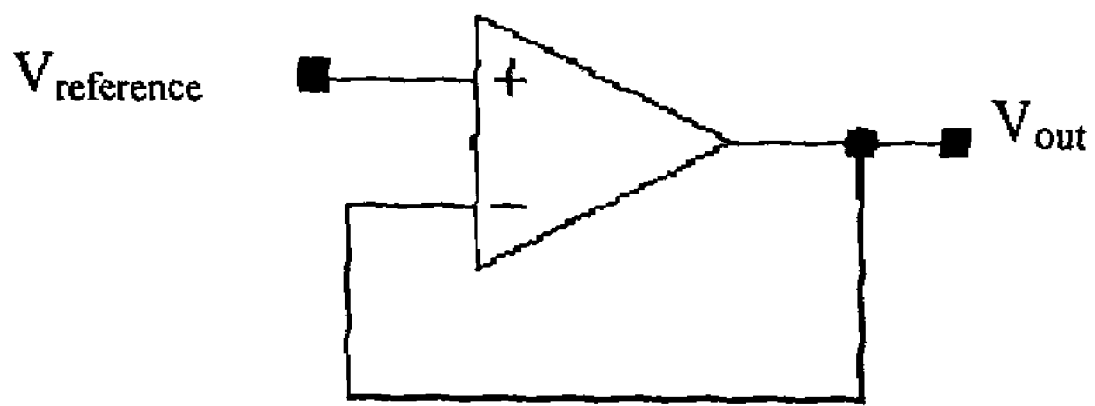
FIG. 7 shows the equivalent circuit of the muting circuit for audio amplifier in accordance with the present invention when the muting signal is a high voltage signal.

When the muting signal $M_0$ is "1" (high voltage), M53 will be conducting, M54 will be opened, thus the constant bias $V_{bias}$ is not inputted to the gate of M57, M57 is therefore opened, Vcc is not provided to Diff_1, and Diff_1 does not work, $V_{in}$ can not generate $V_{out}$, thereby forming the muting effect. Moreover, since M55 is opened, M56 is conducting, $V_{bias}$ is inputted to the gate of M58 to make M58 conducting, Vcc is therefore provided to Diff_2, Diff_2 begins working. In this situation, the equivalent circuit of the present invention is shown in FIG. 7, it is basically an ideal differential pair operation amplifier, the input thereof has no any additional resistance, and $V_{reference}$ is inputted to the input terminal to form the muting effect.

Figure 8:
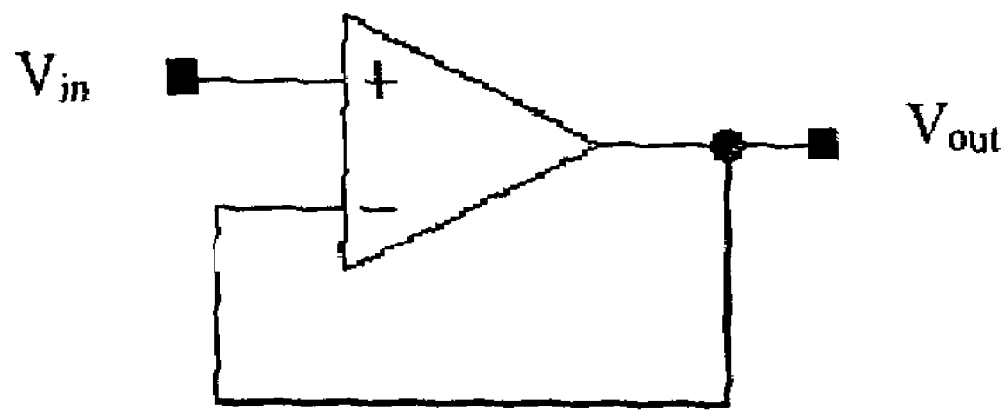
FIG. 8 shows the equivalent circuit of the muting circuit for audio amplifier in accordance with the present invention when the muting signal is a low voltage signal.

When the muting signal $M_0$ is "0" (low voltage), M53 is opened, M54 is conducting, thus the constant bias $V_{bias}$ is inputted to the gate of M57, M57 will be conducting, and provides Vcc to Diff_1, let Diff_1 working, thereby $V_{in}$ is inputted to generate $V_{out}$. Moreover, since M55 is conducting, M56 is opened, thus M58 is opened, Vcc is not provided to Diff_2, Diff_2 cannot work. In this situation, the equivalent circuit of the present invention is shown in FIG. 8, it is basically an ideal differential pair operation amplifier, the input thereof has no any additional resistance, because SW_1 & SW_2 are composed of MOS switchs. The resistance of the MOS switch is almost zero when the MOS switch is conducting, and is almost infinite when the MOS switch is opened. By this kind of design, the effect in prior art that $R_{on}$ varies according to the voltage due to the CMOS switchs M1 and M2 inserting between $V_{in}$ and the amplifier is avoided.

The spirit and scope of the present invention depend only upon the following claims, and are not limited by the above embodiments.

What is claimed is:

1. A muting circuit for audio amplifier, comprising a basic differential amplifier, wherein the basic differential amplifier having a first pair of MOS transistor to form a first differential pair, and having a second pair of MOS transistor to form a current mirror, the first pair of MOS transistor is connected with the second pair of transistor respectively, two gates of the first differential pair are an input and an output of the audio amplifier respectively;

a third pair of MOS transistor forming a second differential pair, the third pair of MOS transistor is connected with the second pair of transistor respectively, two gates of the second differential pair are connected with a bias and the output of the audio amplifier respectively;

two additional sets of MOS transistor switch control the first differential pair and the second differential pair respectively;

a muting signal controls one of the two additional sets of MOS transistor switch through an inverter, while controls the other of the two additional sets of MOS transistor switch via two inverters connected seriesly, so that the muting signal is able to open/close the first differential pair or the second differential pair to form a muting effect.

2. The muting circuit for audio amplifier according to claim 1, wherein each of the two additional sets of MOS transistor switch comprises three MOS transistors, so totally there are six MOS transistors;

a first set of the two additional sets of MOS transistor switch uses a first MOS transistor as a bridge for providing a power source to the first differential pair, and uses a second and a third MOS transistors for receiving the muting signal via the inverter to control the first MOS transistor to provide the power source to the first differential pair;

a second set of the two additional sets of MOS transistor switch uses a fourth MOS transistor as a bridge for providing the power source to the second differential pair, and uses a fifth and a sixth MOS transistors for receiving the muting signal via two inverters to control the fourth MOS transistor to provide the power source to the second differential pair.

* * * * *